United States Patent [19]

Mametani

[11] Patent Number: 5,770,491

[45] Date of Patent: Jun. 23, 1998

[54] MANUFACTURING PROCESS OF A MOS SEMICONDUCTOR DEVICE

[75] Inventor: Tomoharu Mametani, Tokyo, Japan

[73] Assignee: Mitsubishi Denki Kabushiki Kaisha, Tokyo, Japan

[21] Appl. No.: 747,715

[22] Filed: Nov. 8, 1996

[30] Foreign Application Priority Data

May 14, 1996 [JP] Japan .................................. 8-118589

[51] Int. Cl.⁶ .................................................. H01L 21/70
[52] U.S. Cl. ........................................... 438/199; 438/302
[58] Field of Search ................................. 438/34, 35, 56, 438/57, 58

[56] References Cited

U.S. PATENT DOCUMENTS

| | | | |
|---|---|---|---|
| 4,599,789 | 7/1986 | Gasner ..................................... | 29/571 |
| 4,764,477 | 8/1988 | Chang et al. ............................. | 437/57 |
| 4,908,327 | 3/1990 | Chapman ................................. | 437/44 |
| 5,217,910 | 6/1993 | Shimizu et al. .......................... | 437/35 |
| 5,413,945 | 5/1995 | Chien et al. .............................. | 437/57 |
| 5,516,711 | 5/1996 | Wang ........................................ | 437/35 |
| 5,532,176 | 7/1996 | Katada et al. ............................ | 437/35 |

FOREIGN PATENT DOCUMENTS

| | | | |
|---|---|---|---|
| 61-84051 | 4/1986 | Japan . | |
| 64-57749 | 3/1989 | Japan . | |
| 0012960 | 1/1990 | Japan ..................................... | 437/34 |
| 2-230743 | 9/1990 | Japan . | |

*Primary Examiner*—John Niebling
*Assistant Examiner*—Long Pham
*Attorney, Agent, or Firm*—Lowe, Price, LeBlanc & Becker

[57] ABSTRACT

In a manufacturing process of a MOS FET having a C-MOS structure, lightly doped n– diffused layer is formed for source/drain regions in n channel and p channel transistor regions respectively. A p+ diffused layer is further formed for source/drain regions in a p channel transistor region. By a heating process, the n– layer is outweighed by diffusion of p type impurities in the p channel transistor region, and the source/drain current of the p channel MOS FET is secured.

3 Claims, 6 Drawing Sheets

MANUFACTURING PROCESS OF A MOS SEMICONDUCTOR DEVICE

TECHNICAL FIELD

The present invention relates to a manufacturing process of a semiconductor device, particularly to a manufacturing process of a semiconductor device having a C-MOS structure.

BACKGROUND ART

FIGS. 7–12 show a conventional manufacturing process of a semiconductor device having a C-MOS structure. In the conventional manufacturing process, first as shown in FIG. 7, a gate oxide layer 5 and a gate electrode 6 are formed respectively on an n type semiconductor region 2 and a p type semiconductor region 3 in a semiconductor substrate 1. Then, the n type region 2 (p channel MOS formation area A) is covered with a photoresist 7a as shown in FIG. 8, and an n− layer 7 is formed by implanting phosphorus (P) to form an n− type source/drain region in the p type semiconductor region 3 (n channel MOS formation area B).

Next, as shown in FIG. 9, a side wall 8 is formed on the side surface of the gate oxide layer 5 and the gate electrode 6. Next, as shown in FIG. 10, an n+ type source/drain region 10 is formed by implanting arsenic (As) into an n channel type MOS formation region B, and by covering a p channel type MOS formation region A with a photoresist 9.

Next, as shown in FIG. 11, a p+ source/drain region 12 is formed by implanting boron (B) into the p channel type MOS formation region !, and by covering the n channel type MOS formation region B with a photoresist 11.

Next, as shown in FIG. 12, through a heating process, an n− layer 7 at the edge of the p+ source/drain region 12 is outweighed in the p channel type MOS region A, although the lightly doped n− layer 7 remains at the edge of the n+ source/drain 10 in the n channel type MOS region B.

In a conventional manufacturing process of the semiconductor device having a C-MOS structure as described above, a photoengraving process has been done on an n channel MOS FET transistor and a p channel MOS FET transistor respectively. Therefore, in the device employing a LDD (Lightly Doped Drain) structure, it is necessary to align three masks in total, 2 in an n channel side and 1 in a p channel side, and it has been costly.

DISCLOSURE OF THE INVENTION

The present invention intends to solve such conventional problems, and provides a manufacturing process of a semiconductor device having a C-MOS structure in which source/drain current of a p channel MOS FET is not decreased, and a mask alignment process is not increased.

According to one aspect of the present invention, in a manufacturing process of a MOS type semiconductor device, a gate oxide film and a gate are formed respectively on an n type first semiconductor region and a p type second semiconductor region in a semiconductor substrate. An n− layer is formed by implanting n type first impurities concurrently into the first and second semiconductor regions. A side wall is formed on a side surface of the gate oxide film and a gate in the first semiconductor region and second semiconductor region respectively. A p+ type source/drain region deeper than the n− layer is formed by diagonal and rotational ion implantation of p type impurities into the first semiconductor region. An n+ type source/drain region deeper than the n− layer is formed by ion implantation of n type second impurities into the second semiconductor region. Then, the first and second semiconductor regions are heated.

In another aspect of the present invention, in the manufacturing process of a MOS type semiconductor device, the n− layer is outweighed by diffused p type impurities of the p+ type source/drain region in the first semiconductor region by heating.

In another aspect of the present invention, in the manufacturing process of a MOS type semiconductor device, phosphorus is used as the n type first impurities, arsenic is used as the n type second impurities, and boron is used as the p type impurities.

Other features and advantages of this invention will become more apparent from the following descriptions.

BEST MODE FOR CARRYING OUT THE INVENTION

This invention will be described in further detail by way of example with reference to the accompanying drawings.

FIGS. 1–6 illustrate a manufacturing process of a semiconductor device of the present invention, showing cross sectional structures of the device in the process.

Figure 1:
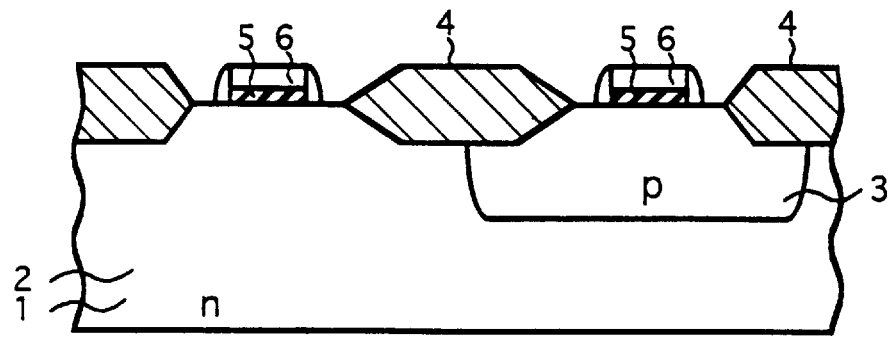
FIG. 1, FIG. 2 (a), FIG. 2 (b), FIG. 3 (a), FIG. 3 (b), FIG. 4 (a), FIG. 4 (b), FIG. 5 (a), FIG. 5 (b), FIG. 6 (a), and FIG. 6 (b) illustrate a manufacturing process of a semiconductor device according to the present invention, showing cross sectional structures of the device in the process.
Figure 2:
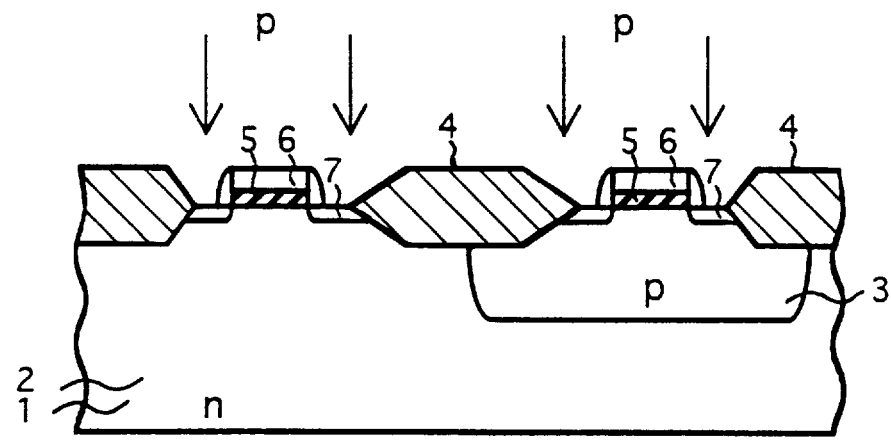
Figure 2:
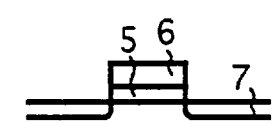
Figure 3:
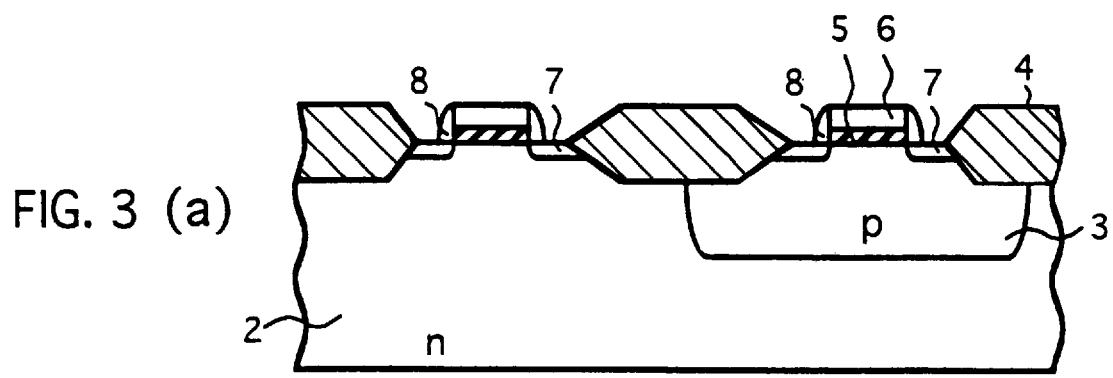
Figure 3:
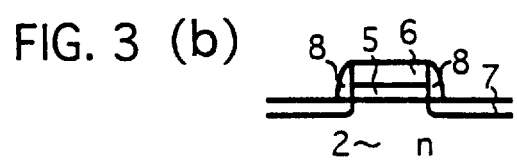

First, as shown in FIG. 1, an n type semiconductor region 2 in the semiconductor substrate 1 is assumed to be a p channel type MOS FET region A. On the other hand, a p− type semiconductor region 3 is formed in the semiconductor substrate 1, and is assumed to be an n-channel type MOS FET region B. Next, an element isolation oxide layer 4 is formed between the p channel MOS FET region A and the n channel MOS FET region B. Next, a gate oxide film 5 and a gate 6 are formed respectively on the p channel MOS FET region A and the n channel MOS FET region B.

Next, as shown in FIG. 2(a), n type impurities, such as phosphorus (P), are implanted into both p channel MOS FET region A and n channel MOS FET region B to form lightly doped n− source/drain regions 7.

FIG. 2(b) shows the distribution of the impurity concentration. At this time, the n type impurities are implanted, for instance, at 0-degree deflection (right angle into a substrate 1), $6.0 \times 10^{13}/cm^2$ dose (6.0 multiplied by the 13th power of ten per square cm), and 20 kev, and is injected up to the depth of 200 Å.

Next, as shown in FIG. 3(a), a sidewall 8 is formed on the side surface of the gate oxide film 5 and the gate 6. This is formed, for instance, by anisotropic etching after a silicon oxide layer is deposited on the entire surface, and by leaving the oxide layer only on the side surface of the gate oxide layer 5 and the gate 6. At this time, as shown in FIG. 3(b), the edge of n type source/drain regions is overlapped with the sidewall 8.

Figure 4:
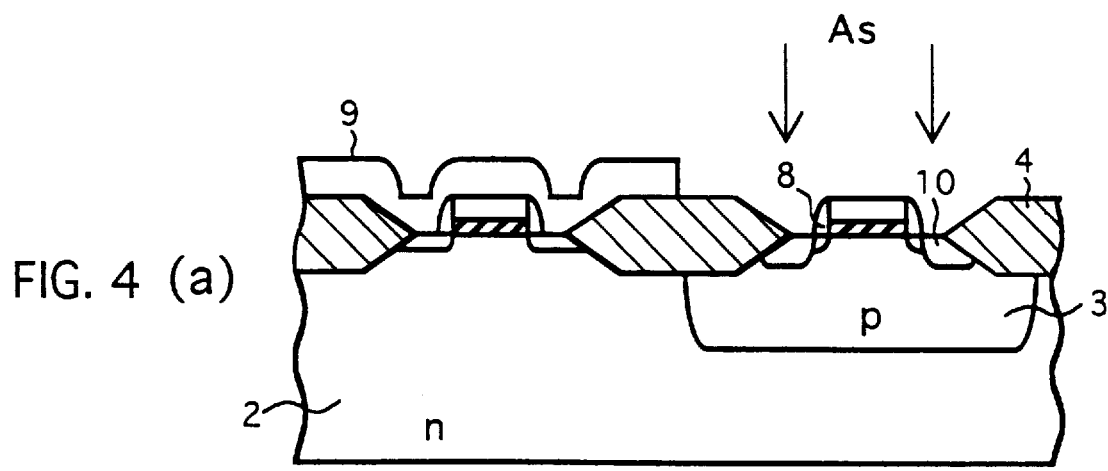
Figure 4:

Next, as shown in FIG. 4(a), through a photoengraving process, a photoresist 9 is formed to cover the p channel MOS FET region A, and n type impurities, such as arsenic (As), are implanted into the n channel MOS FET region B to form n+ source/drain regions, and thus n+ regions 10 are formed. At this time, as shown in FIG. 4 (*b*), the n– region 7 remains under the sidewall 7.

Figure 5:
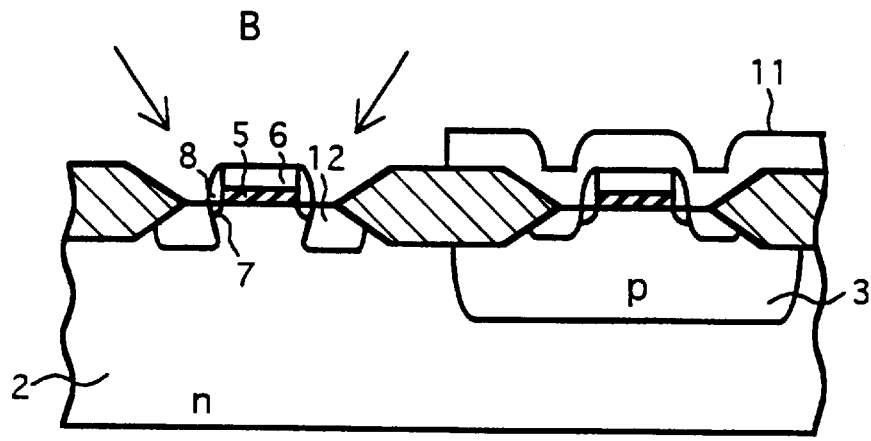
Figure 5:
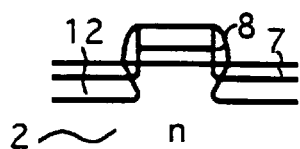

Further, as shown in FIG. 5(*a*), through a photoengraving process, a photoresist 11 is formed to cover the n channel MOS FET region B, and p type impurities, such as boron (B), are implanted into the n channel MOS FET region B to form n+ source/drain regions, and thus n+ regions 10 are formed.

The p type impurities at this time are implanted by diagonal rotation, and as shown in FIG. 5(*b*), the p type impurities are injected under the sidewall 8. For instance, assuming the width of the sidewall is 200 Å, the depth of the n– layer 7 is 200 Å, and the p type impurities are implanted at a 45 degree angle, $4.0 \times 10^{15}/cm^2$ dose (4.0 multiplied by the 15th power of ten per square cm), and at 25 keV. Then, a p+ layer 12 is formed to the depth of about 350 Å, and is extended under the sidewall 8 up to the edge portion of the gate oxide film 4.

Figure 6:
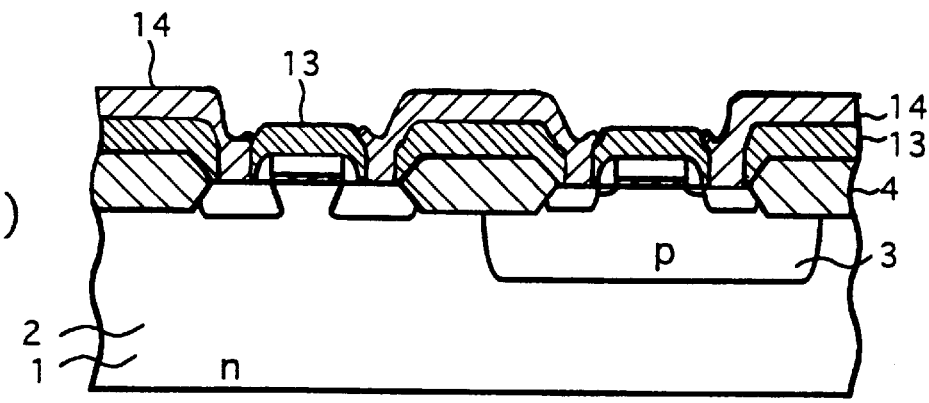
Figure 6:
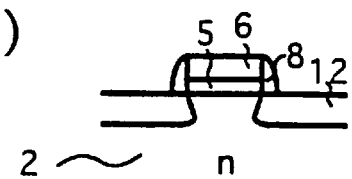
Figure 7:
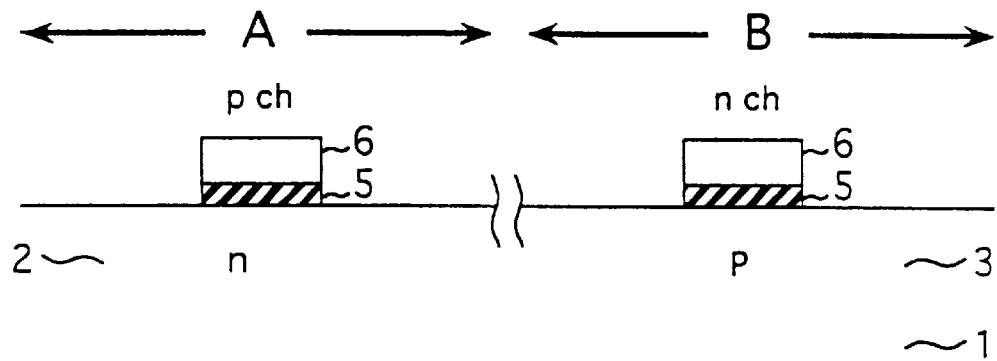
FIGS. 7–12 show a conventional manufacturing process of a semiconductor device having a C-MOS structure.
Figure 8:
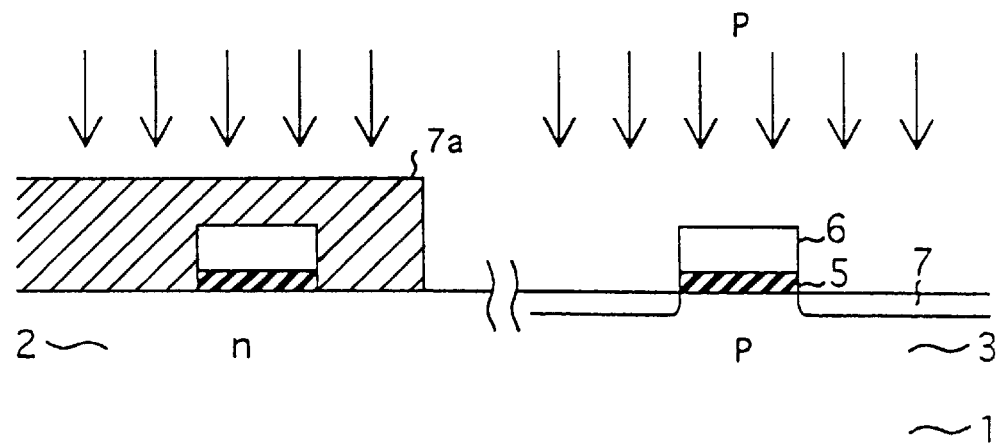
Figure 9:
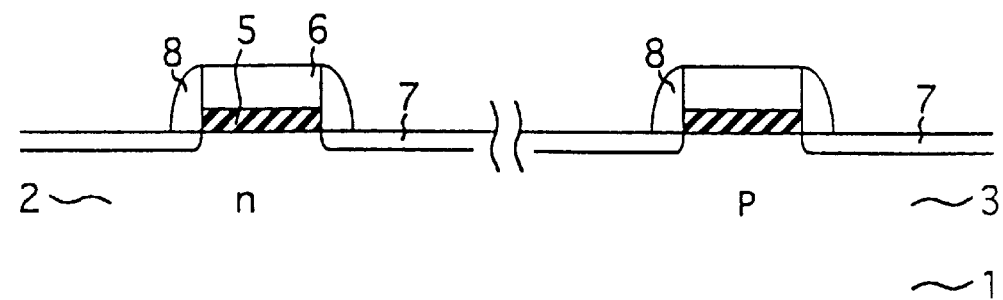
Figure 10:
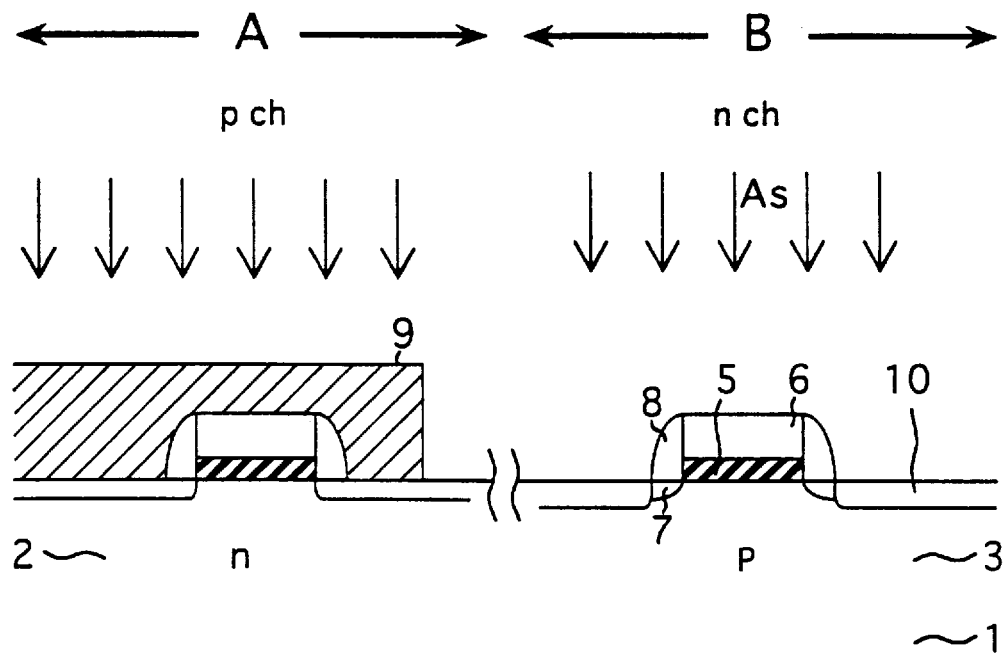
Figure 11:
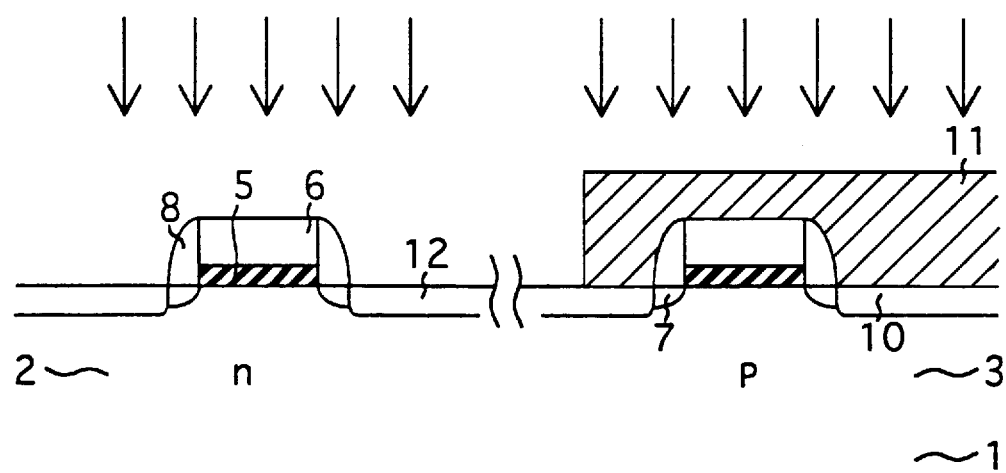
Figure 12:
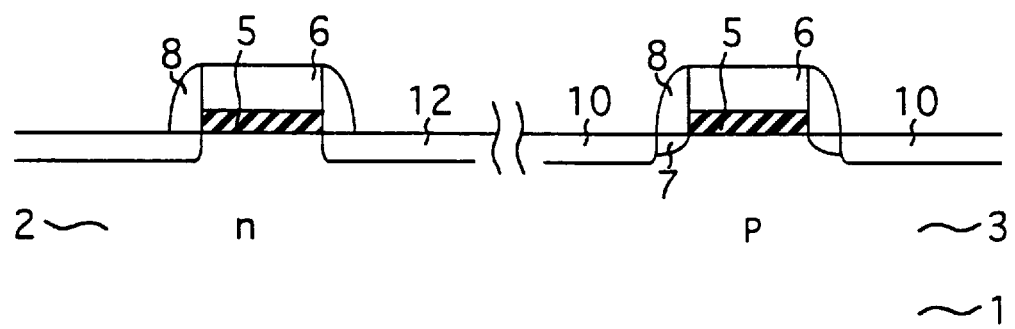

Further, through a heating process, the source/drain structure of MOS FET is formed as shown in FIG. 6(*a*). At this time, as shown in FIG. 6(*b*), the n– layer 7 is outweighed by diffusion of the p+ impurities under the sidewall 8 in the p channel region A, and the n– layer 7 goes out, so that only the p+ layer remains. Afterwards, an insulation layer 13 is formed, and an aluminum lead 14 is disposed.

Further, in the above-mentioned manufacturing process, it is possible to replace the order of the p+ layer formation and the n+ layer formation, etc., and change the material for the source/drain formation, for instance, to inject FB2 in place of B.

In the conventional manufacturing process, the n-layer is also formed in the p channel MOS side, and the LDD n– layer remains. Therefore, the source/drain current is decreased. However, by the manufacturing process of the present invention, the p+ source/drain is formed extending under the sidewall 8 to outweigh the n-layer 7, so that the depletion layer of the source/drain becomes extended easily. Thereby, the source/drain current is not caused to decrease, although the n-impurities are implanted.

Further, by the process as described above, it is possible to decrease one step in a series of processes of a photograving, compared with a conventional process described in the beginning. Thus, the cost is reduced and the duration of the process shortened.

As explained above, according to the manufacturing process of the semiconductor device having a C-MOS structure of the present invention, the steps of the mask alignment process are not increased in number, and the source/drain current of the p channel MOS FET is not caused to decrease.

Obviously many modifications and variations of the present invention are possible in light of the above teachings. It is therefore to be understood that within the scope of the appended claims the invention may be practiced otherwise than as specifically described.

I claim:

1. A method of manufacturing an MOS semiconductor device, which method comprises:

forming a gate oxide film on an n type first region and on a p– type second region in a semiconductor substrate, and forming a gate on each gate oxide film;

forming n– source/drain regions with a channel region therebetween under each gate oxide film by implanting n– type first impurities concurrently into said first region and said second region;

forming a sidewall spacer on a side surface of each gate oxide film and gate thereon in said first region and said second region;

forming a p+ type source/drain region deeper than said n-layer by oblique ion implantation of p– type impurities into said first region;

forming an n+ type source/drain region deeper than said n-layer by ion implantation of n– type second impurities into said second region; and heating said first region and second region.

2. The method according to claim 1, wherein said n– layer is suppressed by diffused p– type impurities of said p+ type source/drain region in said first region by said heating.

3. The method according to claim 1, wherein phosphorus is used as said n– type first impurities, arsenic is used as said n– type second impurities, and boron is used as said p– type impurities.

* * * * *